(12) United States Patent
Tanaka

(10) Patent No.: US 9,911,868 B2
(45) Date of Patent: Mar. 6, 2018

(54) NITRIDE SEMICONDUCTOR DEVICE

(71) Applicant: ROHM CO., LTD., Kyoto (JP)

(72) Inventor: Taketoshi Tanaka, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 204 days.

(21) Appl. No.: 15/080,403

(22) Filed: Mar. 24, 2016

(65) Prior Publication Data

US 2016/0282289 A1    Sep. 29, 2016

(30) Foreign Application Priority Data

Mar. 25, 2015   (JP) ................................. 2015-063257

(51) Int. Cl.
*H01L 29/861* (2006.01)
*H01L 29/778* (2006.01)
(Continued)

(52) U.S. Cl.
CPC .......... *H01L 29/861* (2013.01); *H01L 29/205* (2013.01); *H01L 29/207* (2013.01); *H01L 29/7786* (2013.01); *H01L 29/872* (2013.01); H01L 29/2003 (2013.01); H01L 29/4175 (2013.01); H01L 2224/32245 (2013.01);
(Continued)

(58) Field of Classification Search
CPC .......... H01L 29/861; H01L 2924/00012; H01L 29/872; H01L 29/205; H01L 29/207; H01L 29/7786; H01L 2924/181; H01L 2224/32245; H01L 2224/48247;
(Continued)

(56) References Cited

U.S. PATENT DOCUMENTS

| 2011/0240962 | A1* | 10/2011 | Ikuta ...................... C30B 25/18 257/15 |
| 2013/0214287 | A1* | 8/2013 | Okamoto ............ H01L 21/8252 257/76 |
| 2013/0292690 | A1* | 11/2013 | Ando .................... H01L 29/432 257/76 |

FOREIGN PATENT DOCUMENTS

JP              5064824 B2     10/2012

* cited by examiner

Primary Examiner — Son Le
(74) Attorney, Agent, or Firm — Rabin & Berdo, P.C.

(57) ABSTRACT

A nitride semiconductor device includes: a conductive substrate; a first nitride semiconductor layer which is formed on the substrate and contains Ga or Al; an electron supply layer which is formed in contact with the first nitride semiconductor layer and is made of a second nitride semiconductor having a different composition from that of the first nitride semiconductor layer in an interface between the electron supply layer and the first nitride semiconductor layer; and a source, a gate and a drain or an anode and a cathode which are formed on a front surface of the substrate, wherein the first nitride semiconductor layer has a thickness of w or more, a deep acceptor concentration distribution $N_{DA}(z)$ and a shallow acceptor concentration distribution $N_A(z)$, which satisfy the following equations (1) to (3):

$$\int_0^w \left\{ E_c(x) - \int_0^w \frac{q(N_{DA}(z) + N_A(z))}{\varepsilon_0 \varepsilon} dz \right\} dz \geq V_b \quad (1)$$

$$E_c(x) = 3.3 \times 10^6 \times x + 12 \times 10^6 \times (1-x) \quad (2)$$

$$E(z) = E_c(x) - \int_0^w \frac{q(N_{DA}(z) + N_A(z))}{\varepsilon_0 \varepsilon} dz. \quad (3)$$

10 Claims, 13 Drawing Sheets

(51) Int. Cl.
*H01L 29/207*     (2006.01)
*H01L 29/872*     (2006.01)
*H01L 29/205*     (2006.01)
H01L 29/417       (2006.01)
H01L 29/20        (2006.01)

(52) U.S. Cl.
CPC ............... *H01L 2224/48247* (2013.01); *H01L 2224/48257* (2013.01); *H01L 2224/73265* (2013.01); *H01L 2924/181* (2013.01)

(58) Field of Classification Search
CPC . H01L 2224/48257; H01L 2224/73265; H01L 29/2003; H01L 29/4175
See application file for complete search history.

No bias

Bias applied (state where no current flows)

Bias applied (state where current flows)

NITRIDE SEMICONDUCTOR DEVICE

CROSS-REFERENCE TO RELATED APPLICATION

This application is based upon and claims the benefit of priority from Japanese Patent Application No. 2015-063257, filed on Mar. 25, 2015, the entire contents of which are incorporated herein by reference.

TECHNICAL FIELD

The present disclosure relates to a nitride semiconductor device.

BACKGROUND

There has been proposed an HEMT device in the related art. The HEMT has a heterojunction structure formed by stacking a low temperature buffer layer made of GaN, a buffer layer made of GaN, an electron transit layer made of GaN, and an electron supply layer made of AlGaN, in this order, on a substrate. In addition, the HEMT includes a source electrode, a gate electrode and a drain electrode formed on the electron supply layer.

In the HEMT, the electron supply layer has a larger band gap energy than that of the electron transit layer, and a two-dimensional electron gas layer is formed below a heterojunction interface between these two layers. The two-dimensional electron gas layer is used as a carrier. In other words, when the source electrode and the drain electrode are operated, electrons supplied into the electron transit layer travel through the two-dimensional electron gas layer at a high speed and move to the drain electrode. At this time, by varying the thickness of a depletion layer under the gate electrode by controlling a voltage applied to the gate electrode, electrons moving from the source electrode to the drain electrode (i.e., a drain current) can be controlled.

In the HEMT as described above, in order to reduce a substrate-drain capacitance, the substrate may be coupled to a drain potential. However, the simple change of a coupling-targeted potential of the substrate to the drain potential may lower a dielectric breakdown voltage.

SUMMARY

The present disclosure provides some embodiments of a nitride semiconductor device which is capable of reducing a substrate-drain capacitance while preventing a breakdown voltage from being lowered.

According to one embodiment of the present disclosure, there is provided a nitride semiconductor device including: a conductive substrate; a first nitride semiconductor layer which is formed on the substrate and contains Ga or Al; an electron supply layer which is formed in contact with the first nitride semiconductor layer and is made of a second nitride semiconductor having a different composition from the first nitride semiconductor layer in an interface between the electron supply layer and the first nitride semiconductor layer; and a source, a gate and a drain or an anode and a cathode which are formed on a front surface of the substrate, wherein the first nitride semiconductor layer has a thickness of w or more, a deep acceptor concentration distribution $N_{DA}(z)$ and a shallow acceptor concentration distribution $N_A(z)$, which satisfy the following equations (1) to (3):

[Eq. 1]
$$\int_0^w \left\{ E_c(x) - \int_0^w \frac{q(N_{DA}(z) + N_A(z))}{\varepsilon_0 \varepsilon} dz \right\} dz \geq V_b \quad (1)$$

[Eq. 2]
$$E_c(x) = 3.3 \times 10^6 \times x + 12 \times 10^6 \times (1-x) \quad (2)$$

[Eq. 3]
$$E(z) = E_c(x) - \int_0^w \frac{q(N_{DA}(z) + N_A(z))}{\varepsilon_0 \varepsilon} dz \quad (3)$$

where q represents an elementary charge quantity, $\varepsilon_0$ represents a dielectric constant of vacuum, $\varepsilon$ represents a relative dielectric constant of the first nitride semiconductor layer, $V_b$ represents a dielectric breakdown voltage of the device and $E_c(x)$ represents a dielectric breakdown electric field in the bottom of the first nitride semiconductor layer, wherein, in the equation (1), a Z axis represents an axis of the thickness direction with the bottom of the first nitride semiconductor layer as an origin; wherein, in the equation (2), x represents an element ratio of Ga and Al in the bottom of the first nitride semiconductor layer, which is expressed as x=Ga/(Ga+Al); and wherein, in the equation (3), w represents a value making E(w) equal to 0.

According to another embodiment of the present disclosure, there is provided a nitride semiconductor device including: a conductive substrate; a first nitride semiconductor layer which is formed on the substrate and contains Ga or Al; an electron supply layer which is formed in contact with the first nitride semiconductor layer and is made of a second nitride semiconductor having a different composition from the first nitride semiconductor layer in an interface between the electron supply layer and the first nitride semiconductor layer; and a source, a gate and a drain or an anode and a cathode which are formed on a front surface of the substrate, wherein the first nitride semiconductor layer has a thickness of w or more, a deep acceptor concentration distribution $N_{DA}(z)$, a deep donor concentration distribution $N_{DD}(z)$, a shallow acceptor concentration distribution $N_A(z)$ and a shallow donor concentration distribution $N_D(z)$, which satisfy the following equations (4) to (6):

[Eq. 4]
$$\int_0^w \left\{ E_c(x) - \int_0^w \frac{q\left(\begin{array}{c} N_{DA}(z) + N_A(z) - \\ N_{DD}(z) - N_D(z) \end{array}\right)}{\varepsilon_0 \varepsilon} dz \right\} dz \geq V_b \quad (4)$$

[Eq. 5]
$$E_c(x) = 3.3 \times 10^6 \times x + 12 \times 10^6 \times (1-x) \quad (5)$$

[Eq. 6]
$$E(z) = E_c(x) - \int_0^w \frac{q\left(\begin{array}{c} N_{DA}(z) + N_A(z) - \\ N_{DD}(z) - N_D(z) \end{array}\right)}{\varepsilon_0 \varepsilon} dz \quad (6)$$

where q represents an elementary charge quantity, $\varepsilon_0$ represents a dielectric constant of vacuum, $\varepsilon$ represents a relative dielectric constant of the first nitride semiconductor layer, $V_b$ represents a dielectric breakdown voltage of the device and $E_c(x)$ represents a dielectric breakdown electric field in the bottom of the first nitride semiconductor layer, wherein, in the equation (4), a Z axis represents an axis of the thickness direction with the bottom of the first nitride semiconductor layer as an origin, wherein in the equation (5), x represents an element ratio of Ga and Al in the bottom of the first nitride semiconductor layer, which is expressed as x=Ga/(Ga+Al), wherein, in the equation (6), w represents a value making E(w) equal to 0.

In some embodiments, the first nitride semiconductor layer may have a deep acceptor level formed by doping the first nitride semiconductor layer with an impurity of at least one selected from a group consisting of C, Be Cd, Ca, Cu. Ag, Au, Sr, Iea, Li, Na, K, Sc, Zr, Fe, Co, Ni, Mg, Ar and He.

In some embodiments, an Al composition of the first nitride semiconductor layer may be the highest in the bottom of the first nitride semiconductor layer and decrease as it gets closer to the electron supply layer.

In some embodiments, the first nitride semiconductor layer may include a buffer layer made of aluminum nitride (AlN) in the bottom of the first nitride semiconductor layer.

In some embodiments, the nitride semiconductor device may further include an electrode electrically connected to the substrate.

In some embodiments, the electrode may have the same potential as that of the drain or the cathode.

In some embodiments, the first nitride semiconductor layer may include a laminated structure having three layers having different values of $N_{DA}(z)+N_A(z)-N_{DD}(z)-N_D(z)$ and the value of $N_{DA}(z)+N_A(z)-N_{DD}(z)-N_D(z)$ of a central layer of the laminated structure may be larger than those of other two layers.

In some embodiments, the value of $N_{DA}(z)+N_A(z)-N_{DD}(z)-N_D(z)$ of the central layer of the first nitride semiconductor layer may be equal to or larger than $1\times10^{17}$ cm$^{-3}$.

In some embodiments, the first nitride semiconductor layer may have the value of $N_{DA}(z)+N_A(z)-N_{DD}(z)-N_D(z)$ which is positive in all regions.

According to another embodiment of the present disclosure, there is provided a measurement method including: applying a voltage to an electrode electrically connected to a semi-insulating layer; and calculating $N_{DA}(z)+N_A(z)-N_{DD}(z)-N_D(z)$ contained in the semi-insulating layer from a voltage value at which a current begins to increase, wherein $N_{DA}(z)$ represents a deep acceptor concentration distribution, $N_A(z)$ represents a shallow acceptor concentration distribution, $N_{DA}(z)$ represents a deep donor concentration distribution, and $N_D(z)$ represents a shallow donor concentration distribution.

DETAILED DESCRIPTION

Figure 1:
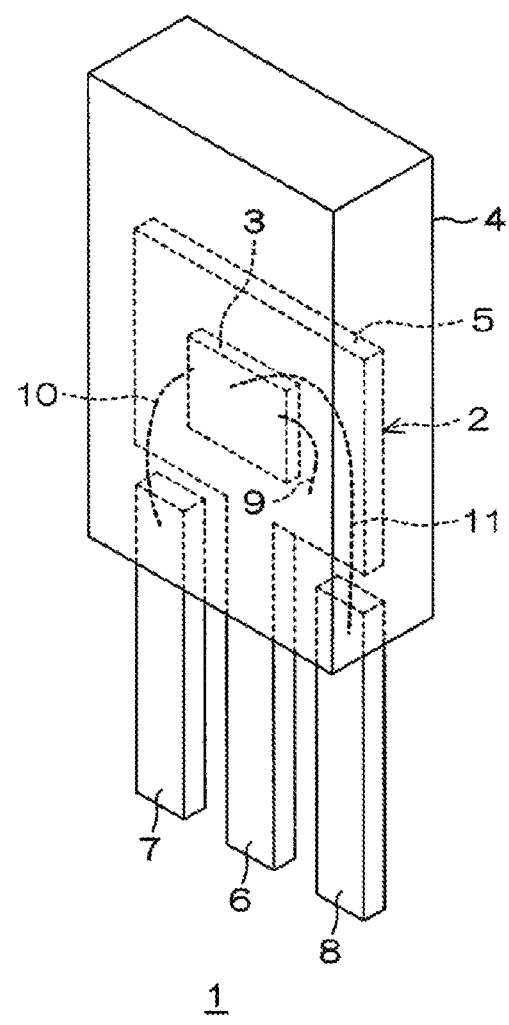
FIG. 1 is an external view of a semiconductor package including a nitride semiconductor device according to one embodiment of the present disclosure.

Embodiments of the present disclosure will now be described in detail with reference to the accompanying drawings. FIG. 1 is an external view of a semiconductor package 1 including a nitride semiconductor device 3 according to one embodiment of the present disclosure. The semiconductor package 1 includes a terminal frame 2, a nitride semiconductor device 3 (chip) and a resin package 4.

The terminal frame 2 is formed of a metal plate. The terminal frame 2 includes a base 5 (island) for supporting the nitride semiconductor device 3, a drain terminal 6, a source terminal 7 and a gate terminal 8. The drain terminal 6 is formed to be integrated with the base 5. The drain terminal 6, the source terminal 7 and the gate terminal 8 are electrically connected to a drain, a source and a gate of the nitride semiconductor device 3 by bonding wires 9 to 11, respectively. The source terminal 7 and the gate terminal 8 are disposed with the drain terminal 6 sandwiched therebetween.

Figure 2:
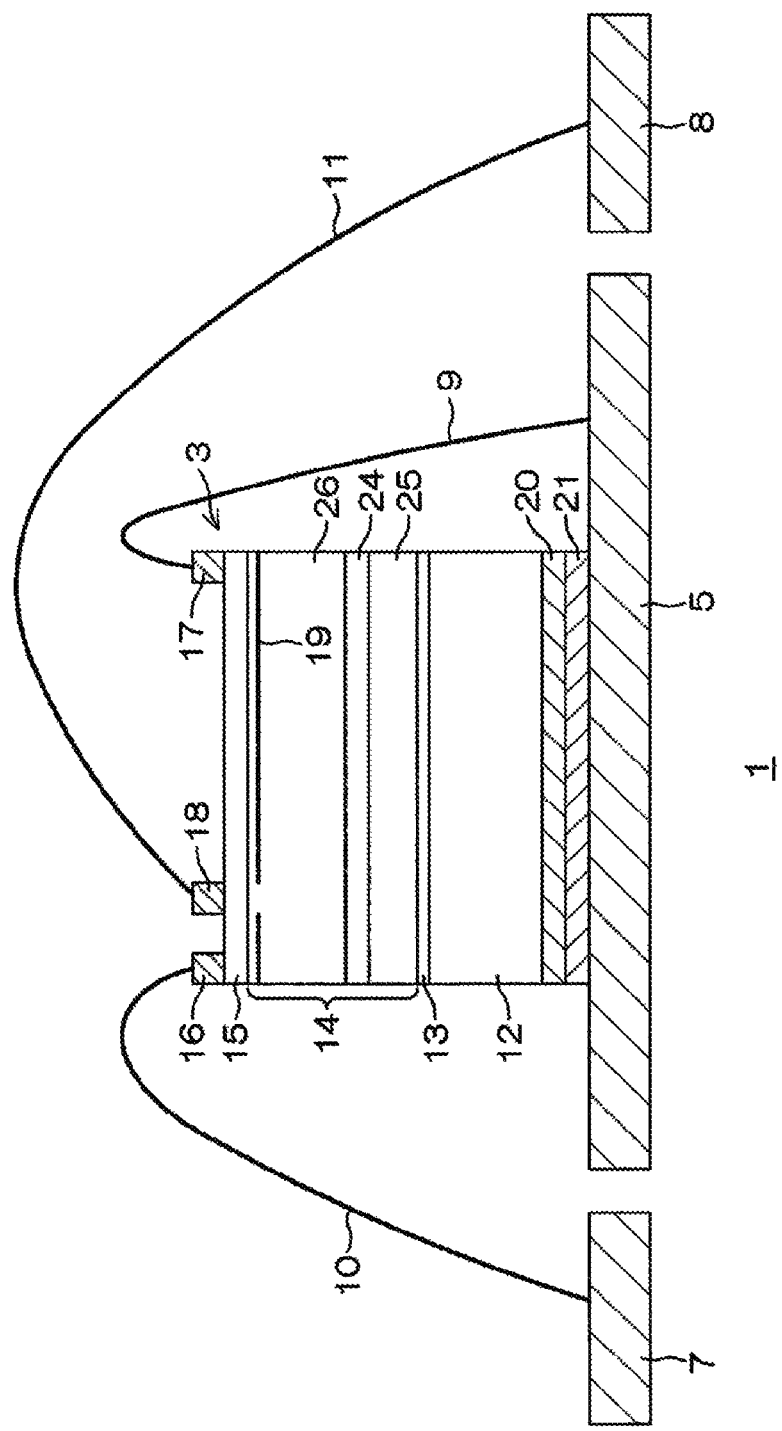
FIG. 2 is a schematic sectional view of the nitride semiconductor device.

The resin package 4 is formed of known mold resin such as epoxy resin and seals the nitride semiconductor device 3. The resin package 4 covers the base 5 and the bonding wires 9 to 11 of the terminal frame 2 as well as the nitride semiconductor device 3. The three terminals 6 to 8 are partially exposed out of the resin package 4. FIG. 2 is a schematic sectional view of the nitride semiconductor device 3. FIG. 2 shows a section of a set of elements considered to be necessary for explanation of this embodiment, rather than a section taken at a certain position in FIG. 1.

The nitride semiconductor device 3 includes a substrate 12, a buffer layer 13 formed on a front surface of the substrate 12, an electron transit layer 14 epitaxially-grown on the buffer layer 13, and an electron supply layer 15 epitaxially-grown on the electron transit layer 14. The nitride semiconductor device 3 further includes a source electrode 16 and a drain electrode 17 which serve as ohmic electrodes in ohmic contact with the electron supply layer 15. The source electrode 16 and the drain electrode 17 are spaced apart from each other, and a gate electrode 18 is interposed therebetween. The gate electrode 18 faces the electron supply layer 15, for example via a gate insulating film (not shown).

The substrate 12 may be, for example, a conductive silicon substrate. The conductive silicon substrate may have an impurity concentration of, for example, $1 \times 10^{17}$ cm$^{-3}$ to $1 \times 10^{20}$ cm$^{-3}$ (more specifically, about $1 \times 10^{18}$ cm$^{-3}$). The substrate 12 may be a conductive GaN substrate, a conductive SiC substrate or the like, instead of the conductive silicon substrate. The buffer layer 13 is formed of, for example, a single film of AlN whose thickness may be, for example, about 0.2 µm. Alternatively, the buffer layer 13 may be a multi-layered buffer layer formed by laminating a plurality of nitride semiconductor films. For example, the buffer layer 13 may be a multi-layered buffer layer including a first buffer layer consisting of an AlN film in contact with the surface of the substrate 12 and a second buffer layer consisting of an AlGaN film laminated on a front surface of the first buffer layer (the surface on the opposite side of the substrate 12).

The electron transit layer 14 and the electron supply layer 15 are formed of a group III nitride semiconductor (hereinafter, simply referred to as "nitride semiconductor") having different Al compositions. For example, the electron transit layer 14 may be formed of a GaN layer and the thickness thereof may be about 0.5 µm. In this embodiment, the electron supply layer 15 is an Al$_x$Ga$_{1-x}$N layer ($0<x<1$) and the thickness thereof is, for example, 5 nm to 30 nm (more specifically, about 20 nm). In addition, the Al composition of the electron transit layer 14 may be reduced as it gets closer from the substrate 12 to the electron supply layer 15. For example, since the electric field intensity in the vicinity of the substrate 12 is increased when the substrate 12 is coupled to the drain potential, a breakdown voltage can be increased if there is a film having a higher Al composition as it comes closer to the substrate 12.

Thus, the electron transit layer 14 and the electron supply layer 15 are formed of nitride semiconductors having different Al compositions to form a heterojunction, causing a lattice mismatch therebetween. Due to polarization caused by the heterojunction and the lattice mismatch, two-dimensional electron gas 19 is spread at a position close to an interface between the electron transit layer 14 and the electron supply layer 15 (for example, a position having a distance of about several Å from the interface).

With respect to its energy band structure, the electron transit layer 14 may be formed with a shallow donor level $E_D$, a deep donor level $E_{DD}$, a shallow acceptor level $E_A$ and a deep acceptor level $E_{DA}$. For example, the shallow donor level $E_D$ is an energy level at a position distant by 0.025 eV or less from the lower end (bottom) energy level $E_C$ of a conduction band of the electron transit layer 14, and may be simply called a "donor level $E_D$" as long as it can be distinguished from the deep donor level $E_{DD}$. Typically, electrons of donors doped at this position are excited to the conduction band to become free electrons even at room temperature (thermal energy kT=about 0.025 eV). An example of an impurity forming the shallow donor level $E_D$ may include at least one selected from a group consisting of Si and O, which may be trapped in a film during epitaxial growth of the electron transit layer 14 or may be intentionally doped. For example, oxygen (O) may be taken from a precursor gas or a carrier gas.

On the other hand, for example, the deep donor level $E_{DD}$ is an energy level that is 0.025 eV or more from the lower end (bottom) energy level $E_C$ of the conduction band of the electron transit layer 14. In other words, the deep donor level $E_{DD}$ is formed by doping of donors whose ionization energy required for excitation is larger than thermal energy at room temperature. Therefore, typically, electrons of donors doped at this position are not excited to the conduction band at room temperature and is in a state of being caught in the donors. The deep donor level $E_{DD}$ may be, for example, caused by crystal defects that occur naturally in GaN during the epitaxial growth of the electron transit layer 14.

For example, the shallow acceptor level $E_A$ is an energy level that is 0.025 eV or less from upper end (top) energy level $E_V$ of a valence band of the electron transit layer 14 and may be simply called an "acceptor level $E_A$" as long as it can be distinguished from the deep acceptor level $E_{DA}$. Typically, holes of acceptors doped at this energy level are excited to the valence band to become free holes even at room temperature (thermal energy kT=about 0.025 eV).

On the other hand, for example, the deep acceptor level $E_{DA}$ is an energy level that is 0.025 eV or more from the upper end (top) energy level $E_V$ of the valence band of the electron transit layer 14. That is, the deep acceptor level $E_{DA}$ is formed by doping of acceptors whose ionization energy required for excitation is larger than the thermal energy at room temperature. Therefore, typically, holes of acceptors doped at this position are not excited to the valence band at room temperature and is in a state of being caught in the acceptors. At room temperature, although Mg is known as an impurity that generates holes, its activation rate (a ratio of generated holes to doping amount) is 1/10 or less and Mg may be interpreted as either a shallow acceptor or a deep acceptor. However, since a value of $N_A+N_{DA}$ is important in the present disclosure, Mg may be interpreted as either a shallow acceptor or deep acceptor. An example of an impurity doped in the electron transit layer 14 made of GaN in order to form the deep acceptor level $E_{DA}$ may include at least one selected from a group consisting of C, Be, Cd, Ca, Cu, Ag, Au, Sr, Ba, Li, Na, K, Sc, Zr, Fe, Co, Ni, Mg, Ar and He.

In this embodiment, the concentrations of impurities (dopants) forming the above-described shallow donor level $E_D$, deep donor level $E_{DD}$, shallow acceptor level $E_A$ and deep acceptor level $E_{DA}$ are called a shallow donor concentration $N_D$, a deep donor concentration $N_{DD}$, a shallow acceptor concentration $N_A$ and a deep acceptor concentration $N_{DA}$. For example, if only carbon (C) as the impurity forming the deep acceptor level $E_{DA}$ is doped in the electron transit layer 14 with a concentration of $0.5 \times 10^{16}$ cm$^{-3}$, this carbon concentration is defined as the deep acceptor concentration $N_{DA}$. These concentrations $N_D$, $N_{DD}$, $N_A$ and $N_{DA}$ can be measured, for example by SIMS (Secondary Ion Mass Spectrometry).

In some embodiments, the overall impurity concentration of the electron transit layer 14 may have a relationship of $N_A+N_{DA}-N_D-N_{DD}>0$. This inequality means that the sum of impurity concentrations ($N_D+N_{DD}$, hereinafter referred to as a donor concentration $N_d$) of donor atoms which can emit electrons is smaller than the sum of impurity concentrations ($N_A+N_{DA}$, hereinafter referred to as a trap concentration $N_t$) of acceptor atoms which can trap the emitted electrons. That is, since almost all the electrons emitted from shallow donor atoms and deep donor atoms in the electron transit layer 14 are not excited to the conduction band and are trapped in shallow acceptor atoms or deep acceptor atoms, the electron transit layer 14 is formed of semi-insulated i-type GaN.

The electron supply layer 15 may have an AlN layer of a thickness of several atoms or so (5 nm or less, in some embodiments 1 nm to 5 nm, and in some embodiments 1 nm to 3 nm) on the electron transit layer 14. Such an AlN layer suppresses electron scattering, thereby contributing to an increase in electron mobility. The gate electrode 18 may include a laminated electrode film including a lower layer contacting the gate insulating film (not shown) and an upper layer laminated on the lower layer. The lower layer may be made of Ni, Pt, Mo, W or TiN and the upper layer may be made of Au or Al. The gate electrode 18 is biased to the source electrode 16, thereby providing an asymmetrical structure in which a gate-source distance is longer than a gate-drain distance. This asymmetrical structure contributes to alleviating a high electric field between the gate and the drain and increasing a breakdown voltage.

For example, the source electrode 16 and the drain electrode 17 are ohmic electrodes containing Ti and Al, and are electrically coupled to the two-dimensional electron gas 19 via the electron supply layer 15. The bonding wires 9 to 11 shown in FIG. 1 are connected to the drain electrode 17, the source electrode 16 and the gate electrode 18, respectively. A rear electrode 20 is formed on the rear surface of the substrate 12 and the substrate 12 is connected to the base 5 via the rear electrode 20 and a bonding material 21. Therefore, in this embodiment, the substrate 12 is electrically connected to the drain electrode 17 via the bonding wire 9, thereby serving as a drain potential.

In the nitride semiconductor device 3, the electron supply layer 15 having an Al composition different from that of the electron transit layer 14 is heterojunction-formed on the electron transit layer 14. Thus, the two-dimensional electron gas 19 is formed in the electron transit layer 14 in the vicinity of the interface between the electron transit layer 14 and the electron supply layer 15, thereby forming HEMT using the two-dimensional electron gas 19 as a channel. The gate electrode 18 faces the electron supply layer 15 with the gate insulating layer (not shown) sandwiched therebetween. When a proper negative voltage is applied to the gate electrode 18, the channel formed in the two-dimensional electron gas 19 can be cut off. Therefore, the source electrode 16 and the drain electrode 17 can be electrically connected to each other or electrically disconnected from each other by applying a control voltage to the gate electrode 18.

In operation, for example, a predetermined voltage (e.g., 200V to 600V) having a positive polarity at the drain electrode 17 side is applied between the source electrode 16 and the drain electrode 17. Under this state, with the source electrode 16 as a reference potential (0V), an Off voltage (e.g., −5V) or an On voltage (e.g., 0V) is applied to the gate electrode 18. In the nitride semiconductor device 3 operating in this manner, in order to increase the breakdown voltage, the electron transit layer 14 has a film thickness of w or more, a deep acceptor concentration distribution $N_{DA}(z)$, a deep donor concentration distribution $N_{DD}(z)$, a shallow acceptor concentration distribution $N_A(z)$ and a shallow donor concentration distribution $N_D(z)$, which satisfy the equations (1) to (3) or (4) to (6).

[Eq. 7]
$$\int_0^w \left\{ E_c(x) - \int_0^w \frac{q(N_{DA}(z) + N_A(z))}{\varepsilon_0 \varepsilon} dz \right\} dz \geqq V_b \quad (1)$$

[Eq. 8]
$$E_c(x) = 3.3 \times 10^6 \times x + 12 \times 10^6 \times (1 - x) \quad (2)$$

[Eq. 9]
$$E(z) = E_c(x) - \int_0^w \frac{q(N_{DA}(z) + N_A(z))}{\varepsilon_0 \varepsilon} dz \quad (3)$$

[Eq. 10]
$$\int_0^w \left\{ E_c(x) - \int_0^w \frac{q \begin{pmatrix} N_{DA}(z) + N_A(z) - \\ N_{DD}(z) - N_D(z) \end{pmatrix}}{\varepsilon_0 \varepsilon} dz \right\} dz \geqq V_b \quad (4)$$

[Eq. 11]
$$E_c(x) = 3.3 \times 10^6 \times x + 12 \times 10^6 \times (1 - x) \quad (5)$$

[Eq. 12]
$$E(z) = E_c(x) - \int_0^w \frac{q \begin{pmatrix} N_{DA}(z) + N_A(z) - \\ N_{DD}(z) - N_D(z) \end{pmatrix}}{\varepsilon_0 \varepsilon} dz \quad (6)$$

In the above equations, q represents an elementary charge quantity, $\varepsilon_0$ represents a dielectric constant of vacuum, $\varepsilon$ represents a relative dielectric constant of the electron transit layer 14, $V_b$ represents a dielectric breakdown voltage of the device and $E_c(x)$ represents a dielectric breakdown electric field in the bottom of the electron transit layer 14. In the equations (1) and (4), a Z axis represents an axis of the thickness direction with the bottom of the electron transit layer 14 as an origin. In the equations (2) and (5), x represents an element ratio of Ga and Al in the bottom of the electron transit layer 14, which is expressed as Ga/(Ga+Al). In the equations (3) and (6), w represents a value making E(w) equal to 0. Here, the left sides of the equations (1) and (4) represent a voltage at which a current begins to flow in the thickness direction of the electron transit layer 14 (i.e., a voltage at which a punch-through occurs in the thickness direction of the electron transit layer 14). In other words, the equations (1) and (4) represent that the nitride semiconductor device 3 has a sufficient breakdown voltage, since the corresponding voltage is higher than the dielectric breakdown voltage $V_b$ of the device.

Figure 3:
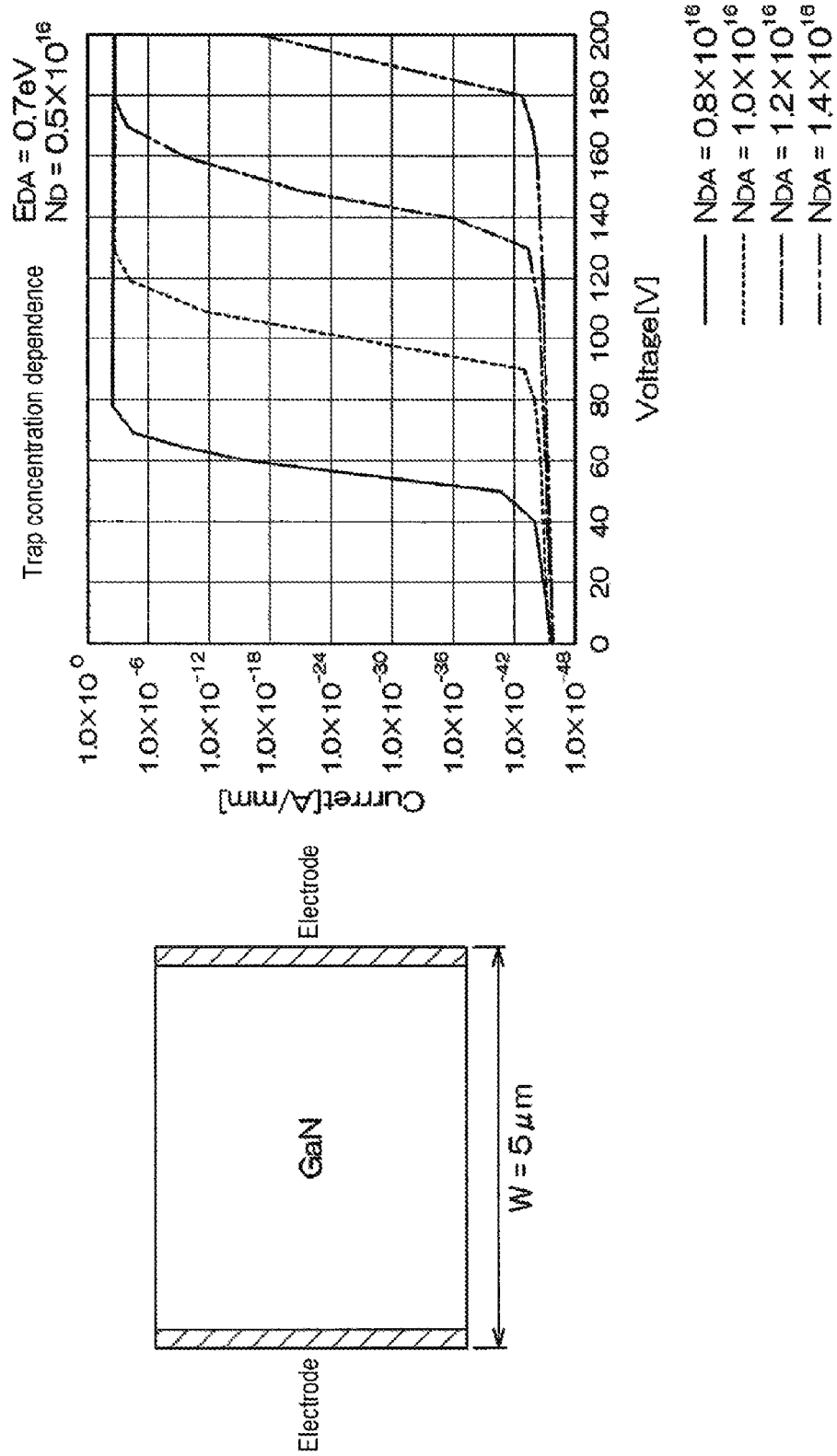
FIG. 3 is a view for explaining the dependence of current on trap concentration.

The left sides of the equations (1) and (4) will be described with reference to FIGS. 3 and 4A to 4C. As shown in FIG. 3, as a sample configuration for simulation, a GaN layer having thickness W (=5 μm), the shallow donor concentration $N_D$ (=0.5×10$^{16}$ cm$^{-3}$) and the deep acceptor level $E_{DA}$ (=0.7 eV) is set. Then, it is verified how the rising of a current is varied depending on the deep acceptor concentration $N_{DA}$ when a voltage (bias) between the front surface electrode and rear surface electrode of the GaN layer is increased. As a result of the verification, as can be clearly seen from FIG. 3, a graph showing substantially the same waveforms of different rising voltages is obtained. In other words, it is apparent from FIG. 3 that a voltage at which a current begins to flow in the GaN layer depends on a trap concentration (the deep acceptor concentration $N_{DA}$ in this simulation).

Figure 4A:
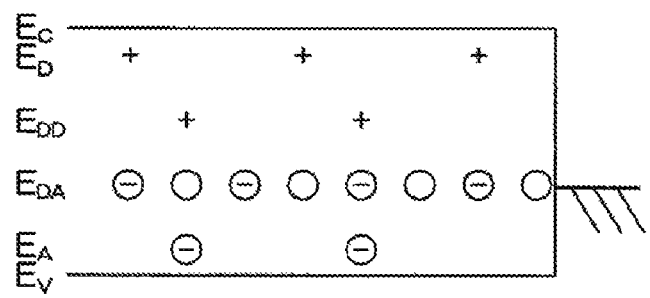
FIGS. 4A to 4C are energy band diagrams showing movement of electrons over time until a current flows out.

In more detail, first, as shown in FIG. 4A, when no voltage (bias) is applied between both electrodes, acceptors and deep acceptors trap electrons emitted by donors and deep donors. At this time, since the number of positive charges by the donors and deep donors that emitted the electrons is equal to the number of negative charges by the acceptors and deep acceptors that trapped the electrons, the GaN layer is electrically neutral as a whole.

Figure 4B:
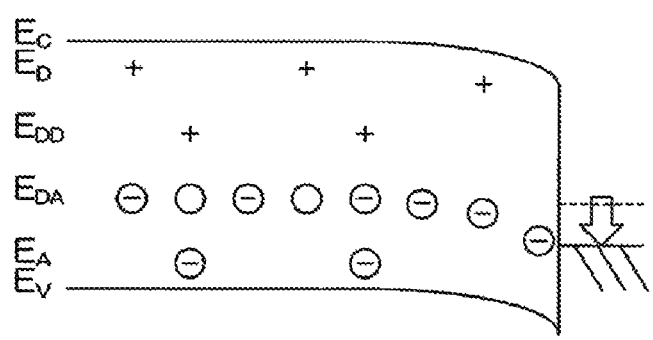
Figure 4C:
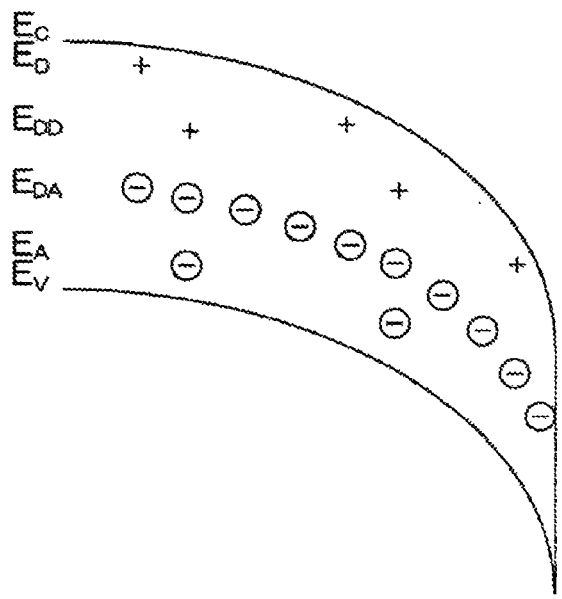

Next, when a voltage is applied as shown in FIG. 4B, the GaN layer is negatively charged, as electrons are trapped from the valence band (Ev) into the deep acceptors in the positive bias side. Since an electric flux generated by the voltage application is cancelled by this negatively-charged region, electrons are not injected from the electron transit layer into the conduction band $E_C$, and a flowing current is very small accordingly. As shown in FIG. 4C, when a specified voltage or higher is applied, electrons are trapped in the deep acceptors of all regions. Even when a further higher voltage is applied, since electron trapping does not occur and an electric flux cannot be cancelled accordingly, electrons are injected from the source electrode into the conduction band $E_C$ and a current flows out accordingly. An equation containing a voltage V at this time is derived, as $N_A+N_{DA}-N_D-N_{DD}=2V\varepsilon_0\varepsilon/qW^2$, from the Poisson equation, resulting in $V=q(N_A+N_{DA}-N_D-N_{DD})\cdot W^2/2\varepsilon_0\varepsilon$.

Figure 5:
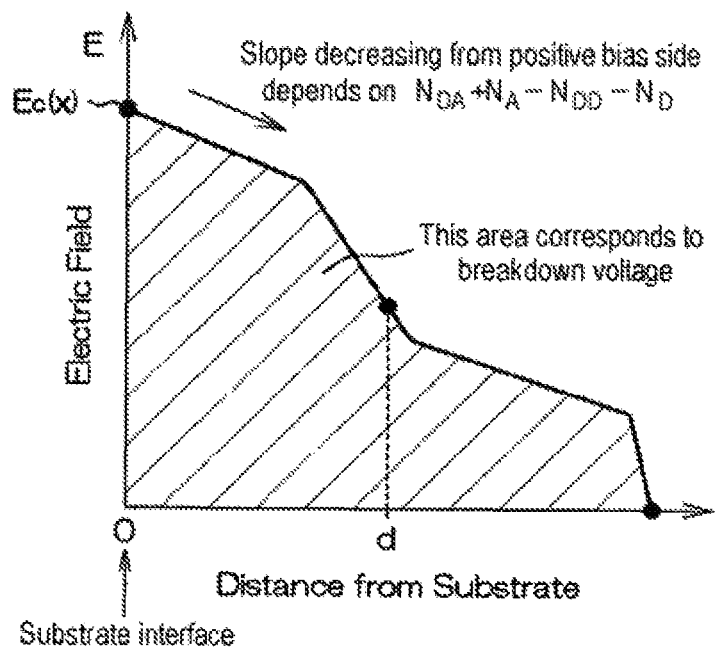
FIG. 5 is a graph showing an electric field intensity distribution of the nitride semiconductor device.

Here, an electric field intensity distribution at the time when a dielectric breakdown electric field occurs in the device is as shown in FIG. 5. In FIG. 5, for example, the electric field intensity at any position d from the front surface (substrate interface) of the substrate 12 in the thickness direction Z is obtained by subtracting an amount of electric field cancellation by the total sum of space charges contained from the substrate interface to the position d from the electric field intensity $E_c(x)$ in the substrate interface, as expressed by the following equation (7).

[Eq. 13]

$$E(z) = Ec(x) - \int_0^d \frac{q\left(\begin{array}{c} N_{DA}(z)+N_A(z)- \\ N_{DD}(z)+N_D(z) \end{array}\right)}{\varepsilon_0\varepsilon} dz \quad (7)$$

Assuming that w represents a position at which the electric field is zero (0), the following equation (6) is derived by replacing d in the equation (7) with w.

[Eq. 14]

$$E(z) = E_c(x) - \int_0^w \frac{q\left(\begin{array}{c} N_{DA}(z)+N_A(z)- \\ N_{DD}(z)-N_D(z) \end{array}\right)}{\varepsilon_0\varepsilon} dz \quad (6)$$

The equation (6) represents an electric field. Since the integration of the electric field gives a voltage, the following equation (8) corresponding to the left side of the equation (4) is derived by integrating the equation (6). This equation (8) represents a voltage that may be applied when the substrate 12 is coupled to the drain potential.

[Eq. 15]

$$\int_0^w \left\{ Ec(x) - \int_0^d \frac{q\left(\begin{array}{c} N_{DA}(z)+N_A(z)- \\ N_{DD}(z)+N_D(z) \end{array}\right)}{\varepsilon_0\varepsilon} dz \right\} dz \quad (8)$$

To summarize the above, the left side (corresponding to the equation (8)) of equation (4) may be designed such that a value of the left side becomes equal to or higher than a desired breakdown voltage $V_b$ at an upper limit of the drain voltage which can be applied when the substrate 12 is coupled to the drain potential. In addition, although the left side of the equation (1) is different from equation (4) in that $(N_A(z)+N_{DA}(z)-N_D(z)-N_{DD}(z))$ in equation (4) becomes $(N_A(z)+N_{DA}(z))$, $(N_A(z)+N_{DA}(z))$ is the minimum amount required to cancel an electric flux and is sufficient if it satisfies the left side of equation (1). However, in consideration of the existence of residual donors in GaN, it is better to satisfy $N_A(z)+N_{DA}(z)-N_D(z)-N_{DD}(z)$ in the equation (4). Next, for a device which satisfies equations (1) to (3) or (4) to (6) and a device which does not satisfy these equations, an electric field intensity distribution and a potential distribution are obtained through simulation.

Figure 6:
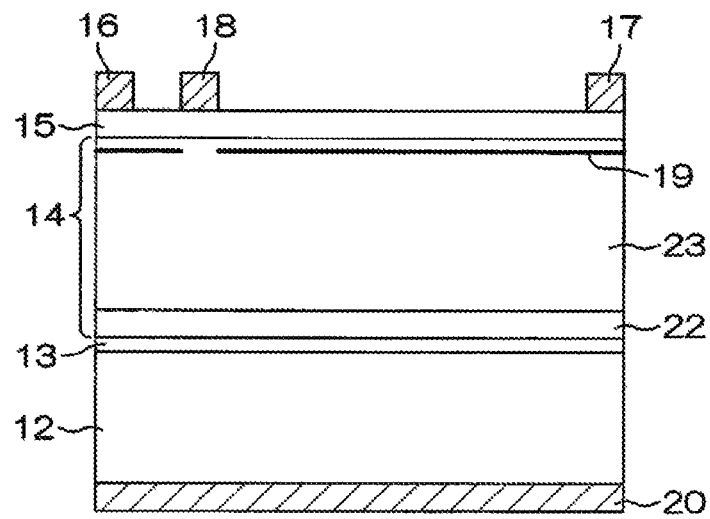
FIG. 6 is a schematic sectional view of a nitride semiconductor device according to a reference example.
Figure 7:
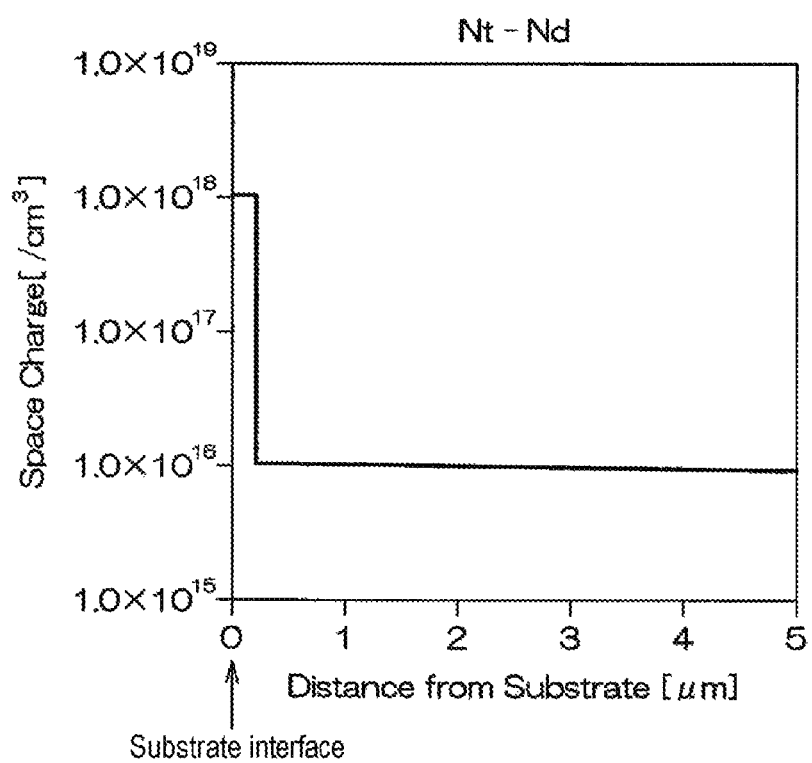
FIG. 7 is a graph showing a trap concentration distribution of the nitride semiconductor device according to the reference example.
Figure 8:
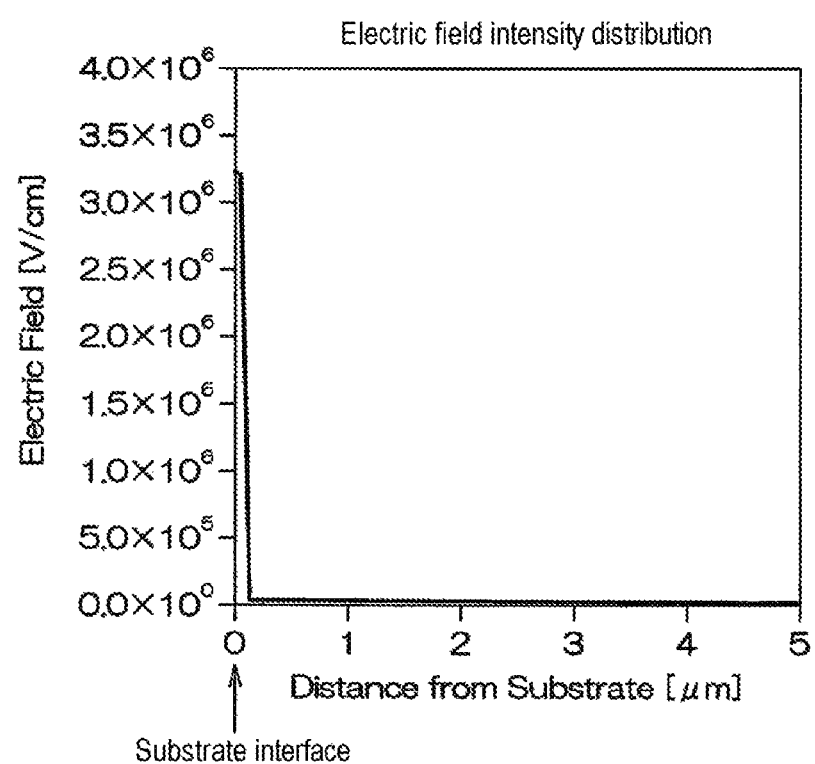
FIG. 8 is a graph showing an electric field intensity distribution of the nitride semiconductor device according to the reference example.
Figure 9:
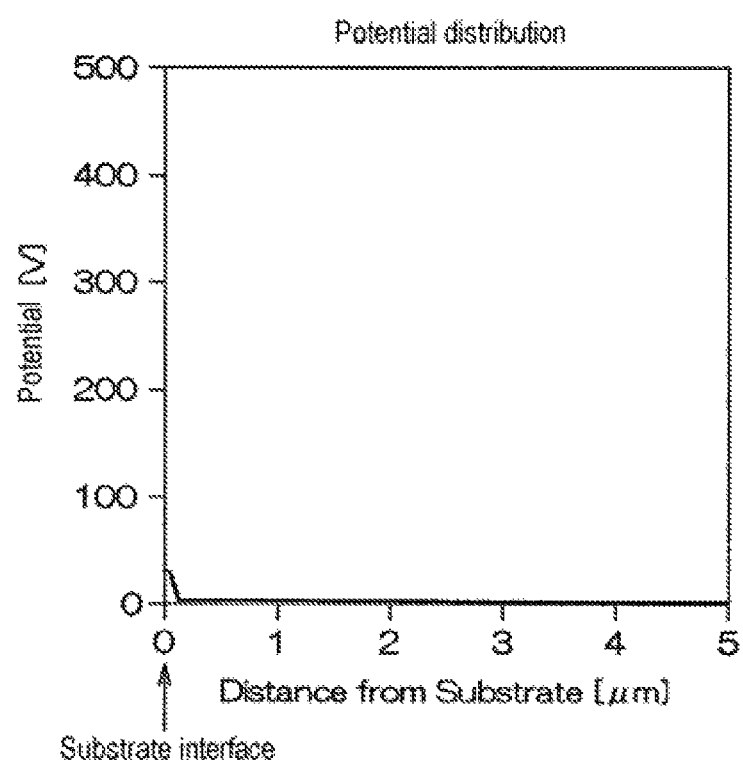
FIG. 9 is a graph showing a potential distribution of the nitride semiconductor device according to the reference example.
Figure 10:
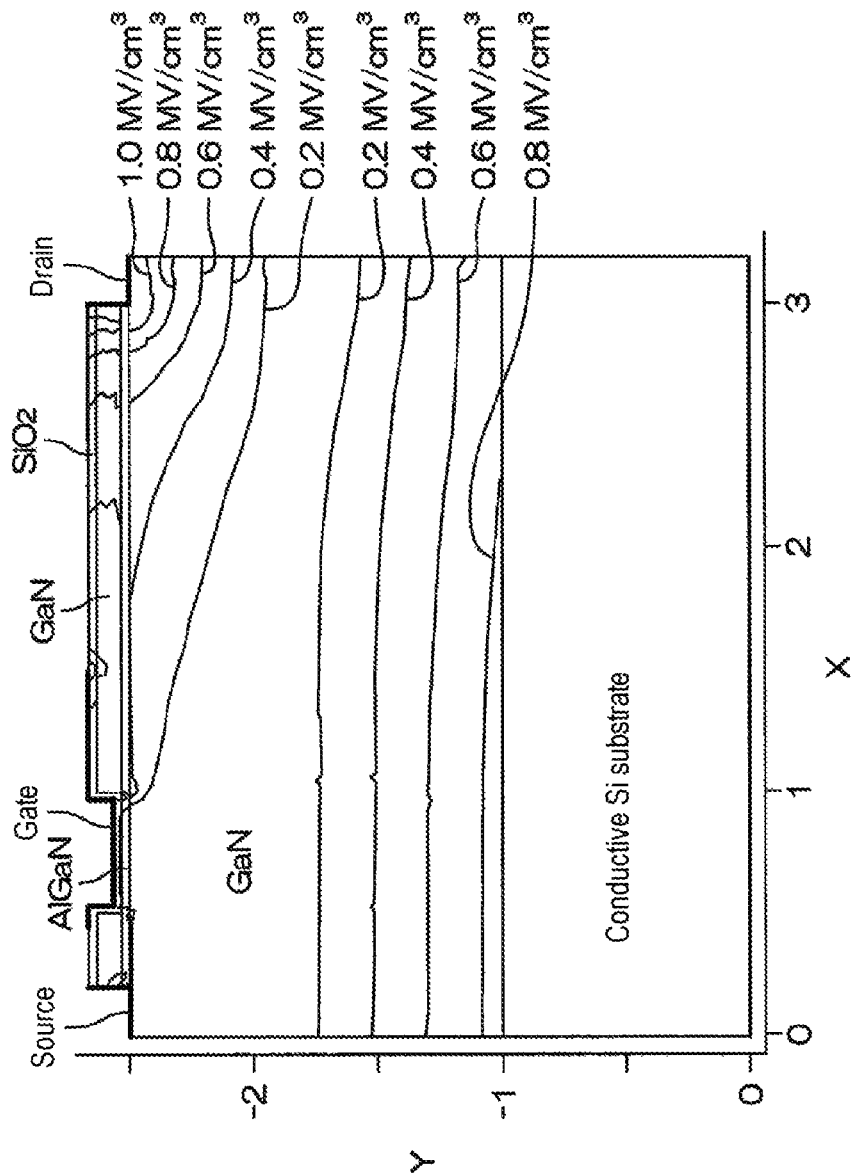
FIG. 10 shows a result of simulation showing the electric field intensity distribution of the nitride semiconductor device according to the reference example.

First, a device according to a reference example is verified. In the device according to the reference example, as shown in FIGS. 6 and 7, the electron transit layer 14 has two regions 22 and 23 having different trap concentrations represented by $N_t-N_d$ (which may be represented by $N_{DA}(z)+N_A(z)-N_{DD}(z)-N_D(z)$) and the first region 22 having a higher trap concentration (=1×10$^{18}$ cm$^{-3}$) is formed in contact with the substrate 12. The second region 23 having a lower trap concentration (=1×10$^{16}$ cm$^{-3}$) than that of the first region 22 is laminated on the first region 22, forming an interface with the electron supply layer 15. For the device of this configuration, results of simulation on an electric field intensity distribution and a potential distribution with the substrate potential as the drain potential are shown in FIGS. 8 to 10. As can be seen from FIGS. 8 and 10, if a trap concentration is assumed to be high/low from the substrate 12 side, an electric field is concentrated on the vicinity of an interface between the substrate 12 and the electron transit layer 14 (i.e., on the first region 22) and a breakdown voltage of only 27V is secured. For calculation of the breakdown voltage, a dielectric breakdown electric field of GaN is set to 3.3 MV/cm.

Figure 11:
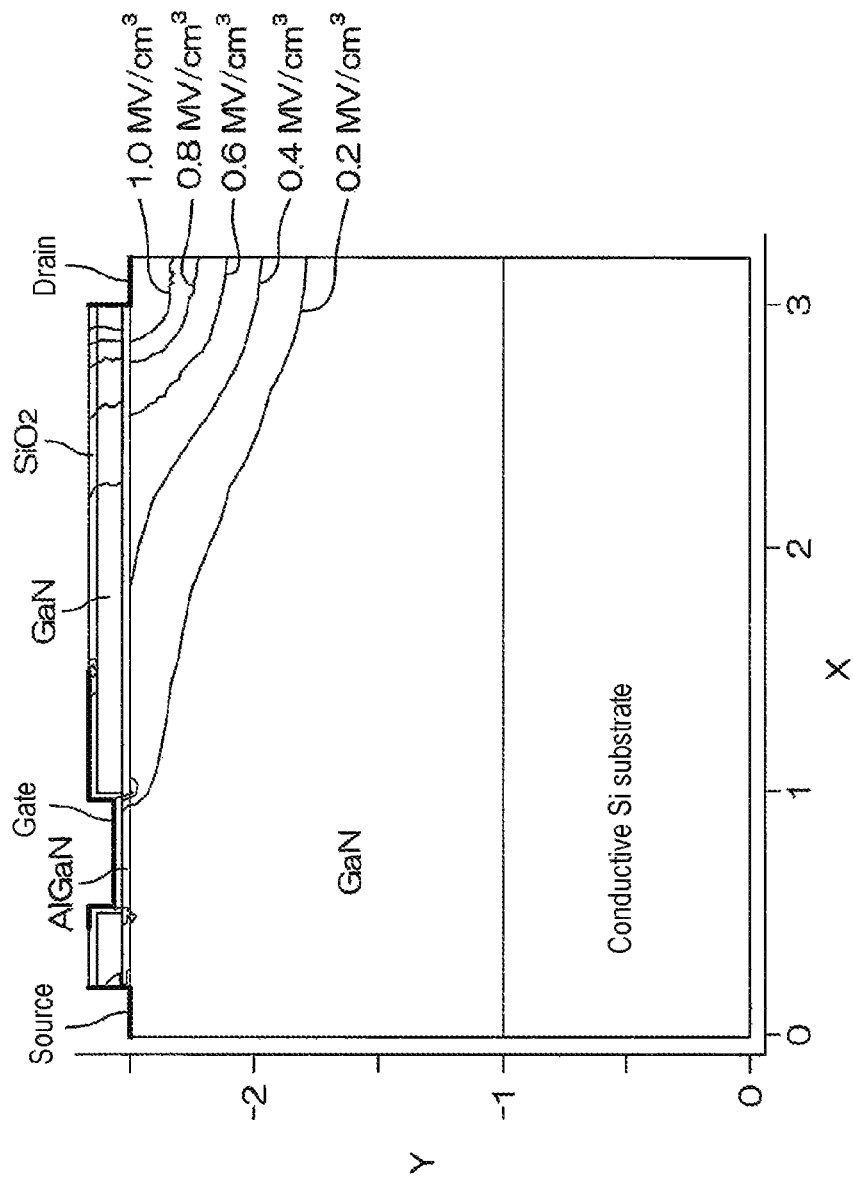
FIG. 11 shows a result of simulation showing an electric field intensity distribution of a nitride semiconductor device according to another reference example.

In this way, in the configuration of the device according to the reference example, when the substrate potential is equal to the drain potential, it appears that an electric field concentration occurs with gate OFF and a breakdown voltage is lowered. Even with this configuration, if the substrate potential is equal to the source potential, an electric field concentration on the vicinity of the interface between the substrate 12 and the electron transit layer 14 can be avoided, as shown in FIG. 11. However, when the substrate potential is equal to the source potential, a capacitance between the two-dimensional electron gas 19 (drain) and the substrate 12 is increased. In addition, since the base 5 of the terminal frame 2 in the semiconductor package 1 and the central terminal extending from the base 5 have to be assumed as the source terminal, change in pin arrangement (terminal arrangement) which has conventionally used the drain terminal as the central terminal is unavoidable. Therefore, there is a possibility of a decreased degree of freedom for device packing.

Figure 12:
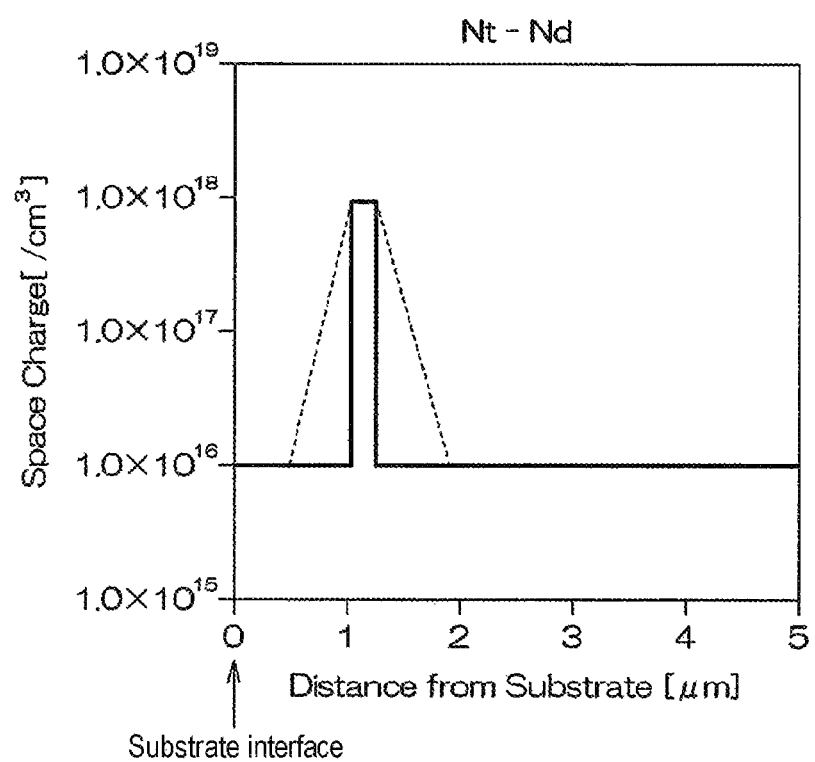
FIG. 12 is a graph showing a trap concentration distribution of the nitride semiconductor device according to this embodiment.

Next, a device according to this embodiment is verified. In the device according to this embodiment, as shown in FIGS. 2 and 12, the electron transit layer 14 includes a laminated structure having at least three regions having different trap concentrations represented by $N_t-N_d$ (which may be represented by $N_{DA}(z)+N_A(z)-N_{DD}(z)-N_D(z)$). In this laminated structure, a value of $N_{DA}(z)+N_A(z)-N_{DD}(z)-N_D(z)$ of the central region of the three regions may be larger than those of the other two regions. For example, the value of $N_{DA}(z)+N_A(z)-N_{DD}(z)-N_D(z)$ of the central region may be 1×10$^{17}$ or more cm$^{-3}$. Thus, a desired breakdown voltage can be achieved with the electron transit layer 14 having a smaller thickness. In this embodiment, the laminated structure has three regions 24 to 26; the first region 24 having a higher trap concentration (=$1\times10^{18}$ cm$^{-3}$) is formed in the center and the second region 25 (its trap concentration=$1\times 10^{16}$ cm$^{-3}$) and the third region 26 (its trap concentration=$1\times 10^{16}$ cm$^{-3}$) which are lower than that of the first region 24 are formed in its thickness direction. For example, in order to achieve a breakdown voltage of 300V, although the electron transit layer 14 having a thickness of 5 μm or so is required for a single layer having a trap concentration of $1\times10^{16}$ cm$^{-3}$, the electron transit layer 14 having a thickness of 1 μm or so is sufficient if there is a layer having a higher trap concentration. The second region 25 is formed between the substrate 12 and the first region 24 in contact with the substrate 12. The third region 26 is formed between the first region 24 and the electron supply layer 15 and forms an interface with the electron supply layer 15. In addition, the trap concentrations of the second region 25 and the third region 26 may be the same or different. In addition, the regions 24 to 26 may be formed substantially in parallel to the front surface of the substrate 12.

Figure 13:
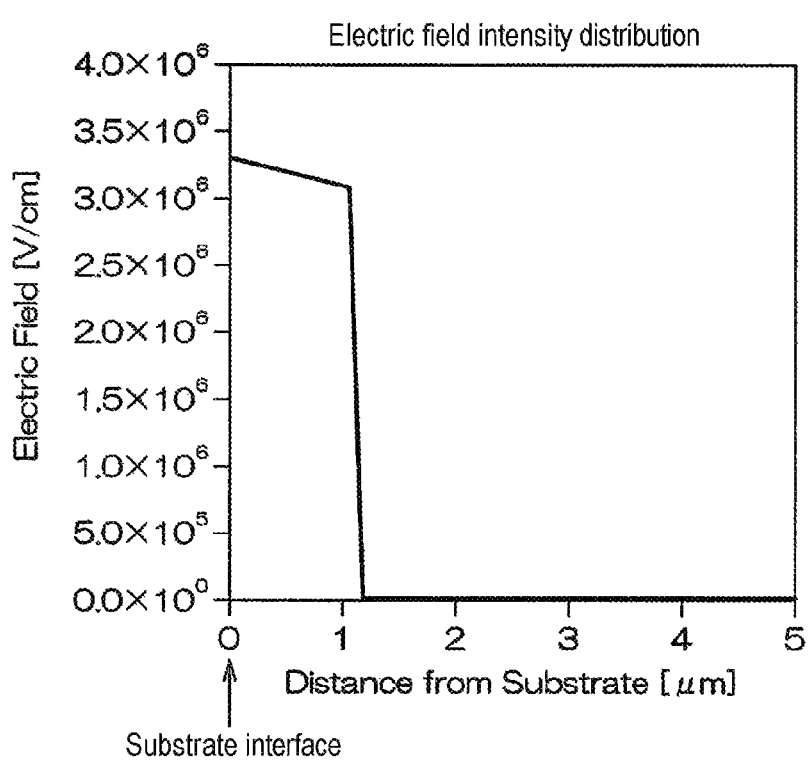
FIG. 13 is a graph showing an electric field intensity distribution of the nitride semiconductor device according to this embodiment.
Figure 14:
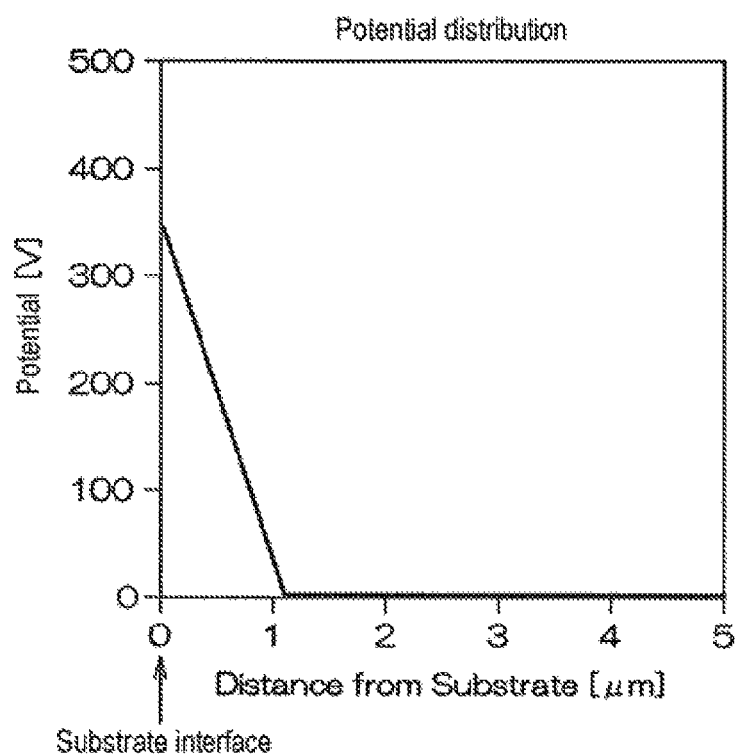
FIG. 14 is a graph showing a potential distribution of the nitride semiconductor device according to this embodiment.

In addition, as indicated by a broken line in FIG. 12, the trap concentration in the electron transit layer 14 may be continuously increased from the front surface of the substrate 12 in the thickness direction and subsequently may be continuously decreased with the first region 24 as a peak. In other words, the trap concentration in the electron transit layer 14 may be continuously changed in the thickness direction. For the device of this configuration, results of simulation on an electric field intensity distribution and a potential distribution with the substrate potential as the drain potential are shown in FIGS. 13 and 14. As can be seen from FIGS. 2 and 12, if a trap concentration is assumed to be low/high/low from the substrate 12 side, an electric field concentration on the vicinity of an interface between the substrate 12 and the electron transit layer 14 is mitigated and a breakdown voltage of 330V is secured. For calculation of the breakdown voltage, a dielectric breakdown electric field of GaN is set to 3.3 MV/cm.

In this way, in the configuration of the device according to this embodiment, even when the substrate potential is equal to the drain potential, it appears that no electric field concentration occurs with gate OFF and a breakdown voltage is prevented from being lowered. Moreover, since the substrate potential is equal to the drain potential, it is possible to reduce a substrate-drain capacitance. In addition, since it is unnecessary to change pin arrangement (terminal arrangement) of the terminal frame 2 in the semiconductor package 1, it is possible to maintain a high degree of freedom for device packing.

Figure 15:
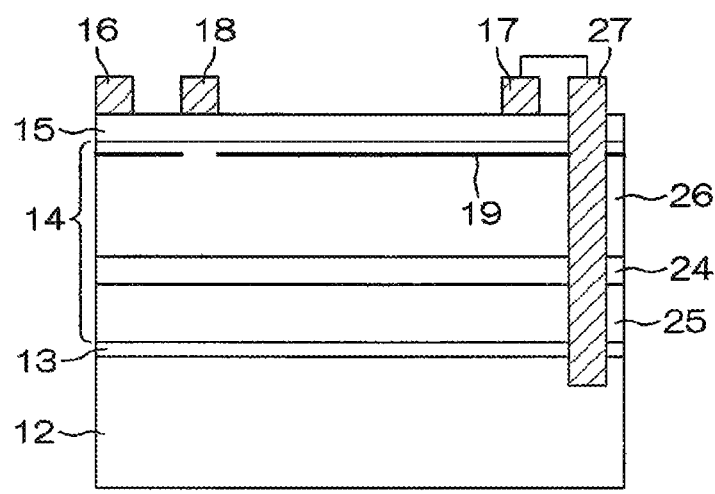
FIG. 15 is a schematic sectional view of a nitride semiconductor device according to a modification of this embodiment.

While the embodiment of the present disclosure has been described above, the present disclosure may be practiced in other different forms. For example, it has been illustrated in the above embodiment that the substrate 12 is coupled to the drain potential by contact to the rear surface of the substrate 12. However, as shown in FIG. 15, a contact (through-contact 27) may be formed to reach the substrate 12 through the electron supply layer 15 and the electron transit layer 14 from the front surface of the substrate 12 and the through-contact 27 may be electrically connected to the drain electrode 17 in a circuit formed on the electron supply layer 15.

In addition, although it has been illustrated in the above embodiment that the source electrode 16, the drain electrode 17 and the gate electrode 18 are formed on the electron supply layer 15, the present disclosure may be applied to a Schottky barrier diode (SBD) including an anode and a cathode formed on the electron supply layer 15. In this case, the base of the terminal frame 2 shown in FIGS. 1 and 2 may be integrated with the cathode terminal.

In addition, although not shown, the gate electrode 18 may have a field plate extending a region on the substrate 12 toward the drain electrode 17. In addition, although it has been illustrated in the above embodiment that the electron transit layer 14 is formed of GaN and the electron supply layer 15 is formed of AlGaN, other combinations of the electron transit layer 14 and the electron supply layer 15 may be used, as long as Al compositions of the electron transit layer 14 and the electron supply layer 15 are different. A combination of the electron supply layer/electron transit layer may include any one of an AlGaN layer/GaN layer, an AlGaN layer/AlGaN layer (with different Al compositions), an AlInN layer/AlGaN layer, an AlInN layer/GaN layer, an AlN layer/GaN layer, and an AlN layer/AlGaN layer. More generally, the electron supply layer contains Al and N in its composition. The electron transit layer contains Ga and N in its composition but has a different Al composition from that of the electron supply layer. By making the Al compositions in the electron supply layer and the electron transit layer different from each other, there is a lattice mismatch between them, resulting in contribution of carriers caused by polarization to formation of a two-dimensional electron gas.

According to the present disclosure in some embodiments, since the first nitride semiconductor layer has a thickness of w or more, a deep acceptor concentration distribution $N_{DA}(z)$, a deep donor concentration distribution $N_{DD}(z)$, a shallow acceptor concentration distribution $N_A(z)$ and a shallow donor concentration distribution $N_D(z)$, which satisfy the above equations (1) to (3) or (4) to (6), it is possible to prevent the breakdown voltage from being lowered even when the conductive substrate is at the drain potential. Further, since the substrate potential is equal to the drain potential, it is possible to reduce a substrate-drain capacitance.

Besides, various modifications and changes in design are possible without departing from the scope defined in the claims.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A nitride semiconductor device comprising:
   a conductive substrate;
   a first nitride semiconductor layer which is formed on the substrate and contains Ga or Al;
   an electron supply layer which is formed in contact with the first nitride semiconductor layer and is made of a second nitride semiconductor having a different composition from that of the first nitride semiconductor layer in an interface between the electron supply layer and the first nitride semiconductor layer; and
   a source, a gate and a drain or an anode and a cathode which are formed on a front surface of the substrate,
   wherein the first nitride semiconductor layer has a thickness of w or more, a deep acceptor concentration distribution $N_{DA}(z)$ and a shallow acceptor concentration distribution $N_A(z)$, which satisfy the following equations (1) to (3):

$$\int_0^w \left\{ E_c(x) - \int_0^w \frac{q(N_{DA}(z) + N_A(z))}{\varepsilon_0 \varepsilon} \right\} dz \geq V_b \quad (1)$$

$$E_c(x) = 3.3 \times 10^6 \times x + 12 \times 10^6 \times (1-x) \quad (2)$$

$$E(z) = E_c(x) - \int_0^w \frac{q(N_{DA}(z) + N_A(z))}{\varepsilon_0 \varepsilon} dz, \quad (3)$$

where q represents an elementary charge quantity, $\in_0$ represents a dielectric constant of vacuum, $\in$ represents a relative dielectric constant of the first nitride semiconductor layer, $V_b$ represents a dielectric breakdown voltage of the device, and $E_c(x)$ represents a dielectric breakdown electric field in a bottom of the first nitride semiconductor layer, wherein, in the equation (1), a Z axis represents an axis of a thickness direction of the first nitride semiconductor layer with the bottom of the first nitride semiconductor layer as an origin, wherein, in the equation (2), x represents an element ratio of Ga and Al in the bottom of the first nitride semiconductor layer, which is expressed as x=Ga/(Ga+Al), and wherein, in the equation (3), w represents a value making E(w) equal to 0.

2. The nitride semiconductor device of claim 1, wherein the first nitride semiconductor layer has a deep acceptor level formed by doping the first nitride semiconductor layer with impurity of at least one selected from a group consisting of C, Be, Cd, Ca, Cu, Ag, Au, Sr, Ba, Li, Na, K, Sc, Zr, Fe, Co, Ni, Mg, Ar and He.

3. The nitride semiconductor device of claim 1, wherein an Al composition of the first nitride semiconductor layer is the highest in the bottom of the first nitride semiconductor layer and is decreased as it gets closer to the electron supply layer.

4. The nitride semiconductor device of claim 1, wherein the first nitride semiconductor layer includes a buffer layer made of aluminum nitride (AlN) in the bottom of the first nitride semiconductor layer.

5. The nitride semiconductor device of claim 1, further comprising an electrode electrically connected to the substrate.

6. The nitride semiconductor device of claim 5, wherein the electrode has the same potential as that of the drain or the cathode.

7. A nitride semiconductor device comprising:
a conductive substrate;
a first nitride semiconductor layer which is formed on the substrate and contains Ga or Al;
an electron supply layer which is formed in contact with the first nitride semiconductor layer and is made of a second nitride semiconductor having a different composition from that of the first nitride semiconductor layer in an interface between the electron supply layer and the first nitride semiconductor layer; and
a source, a gate and a drain or an anode and a cathode which are formed on a front surface of the substrate,
wherein the first nitride semiconductor layer has a thickness of w or more, a deep acceptor concentration distribution $N_{DA}(z)$, a deep donor concentration distribution $N_{DD}(z)$, a shallow acceptor concentration distribution $N_A(z)$ and a shallow donor concentration distribution $N_D(z)$, which satisfy the following equations (4) to (6):

$$\int_0^w \left\{ E_c(x) - \int_0^w \frac{q\left(\begin{array}{c} N_{DA}(z) + N_A(z) - \\ N_{DD}(z) - N_D(z) \end{array}\right)}{\varepsilon_0 \varepsilon} \right\} dz \geq V_b \quad (4)$$

$$E_c(x) = 3.3 \times 10^6 \times x + 12 \times 10^6 \times (1-x) \quad (5)$$

$$E(z) = E_c(x) - \int_0^w \frac{q\left(\begin{array}{c} N_{DA}(z) + N_A(z) - \\ N_{DD}(z) - N_D(z) \end{array}\right)}{\varepsilon_0 \varepsilon} dz \quad (6)$$

where q represents an elementary charge quantity, $\in_0$ represents a dielectric constant of vacuum, $\in$ represents a relative dielectric constant of the first nitride semiconductor layer, $V_b$ represents a dielectric breakdown voltage of the device and $E_c(x)$ represents a dielectric breakdown electric field in a bottom of the first nitride semiconductor layer, wherein, in the equation (4), a Z axis represents an axis of a thickness direction of the first nitride semiconductor layer with the bottom of the first nitride semiconductor layer as an origin, wherein, in the equation (5), x represents an element ratio of Ga and Al in the bottom of the first nitride semiconductor layer, which is expressed as x=Ga/(Ga+Al), and wherein, in the equation (6), w represents a value making E(w) equal to 0.

8. The nitride semiconductor device of claim 7, wherein the first nitride semiconductor layer includes a laminated structure having three layers having different values of $N_{DA}(z)+N_A(z)-N_{DD}(z)-N_D(z)$ and the value of $N_{DA}(z)+N_A(z)-N_{DD}(z)-N_D(z)$ of a central layer of the laminated structure is larger than those of other two layers.

9. The nitride semiconductor device of claim 8, wherein the value of $N_{DA}(z)+N_A(z)-N_{DD}(z)-N_D(z)$ of the central layer of the first nitride semiconductor layer is equal to or larger than $1 \times 10^{17}$ cm$^{-3}$.

10. The nitride semiconductor device of claim 7, wherein the first nitride semiconductor layer has the value of $N_{DA}(z)+N_A(z)-N_{DD}(z)-N_D(z)$ which is positive in all of regions.

* * * * *